AUDIO POWER TRANSISTOR SELF-BIASING CIRCUIT

Filed May 7, 1963

E. D. HASTY, JR.
C. H. LINGG
L. KUKLA
INVENTORS

BY Killman, Smith & Lamb
ATTORNEYS

United States Patent Office 3,255,420

Patented June 7, 1966

3,255,420

AUDIO POWER TRANSISTOR SELF-BIASING CIRCUIT

Leonard Kukla, Lutherville, Charles H. Lingg, Reisterstown, and Emmett D. Hasty, Jr., Baltimore, Md.

Filed May 7, 1963, Ser. No. 278,725

1 Claim. (Cl. 330—23)

This application is a continuation-in-part of application Serial No. 820,144, filed June 15, 1959, now abandoned.

This invention relates generally to transistor circuits and more particularly to transistor amplifiers of the type employed as output stages in radio receivers.

Transistor amplifiers are currently in widespread use and have found particular utility in the audio circuits of broadcast receiver equipment such as automobile radios. While some applications of the transistor for this purpose have provided completely transistorized receivers, other applications employ a hybrid circuit in which a portion of the radio set operates with conventional vacuum tubes while the audio output stage and, at times, the audio driver stage have been designed to use transistors. Due to the widely varying characteristics of commercially available transistors it is essential that high volume, low cost equipment such as automobile radios be designed to operate with non-selected transistors and, if possible, without adjustment of component values during production. Circuits of this type require the maintenance of thermal stability without sacrificing power gain for non-selected transistors which exhibit a wide variation in their characteristics pertaining to these criteria.

It is the object of the present invention to provide a new and improved transistor circuit.

Another object of this invention is to provide a circuit in which low cost transistors having widely vraying characteristics can be used to obtain satisfactory amplification performance.

A further object of the invention is to provide a transistor circuit having no adjustable bias components, but which provides satisfactory gain and thermal stability in individual receivers which are manufactured in large numbers with transistors which are nonselected and have a widely varying gain characteristic.

These and other objects of the invention will be apparent from the following detailed description taken in conjunction with the accompanying drawings.

Briefly, the present invention comprises a grounded emitter transistor amplifier in which an emitter resistor operates at a temperature substantially above ambient thereby causing its resistance to vary with the current flow therethrough.

In accordance with the invention the emitter connection to a power transistor is made through a resistor which will provide increased resistance values as the current therethrough increases. This result is achieved by using a resistor made of positive temperature coefficient wire with low thermal conductivity and drawing sufficient current therethrough to raise the wire temperature substantially above the ambient temperature. Such a resistor has for purposes of the invention been termed herein "a self-heating" resistor. Under these conditions a relatively inexpensive resistor wound of positive temperature coefficient wire of substantial size can be used as the emitter resistor and, due to its elevated temperature, the resistance of the resistor will vary with the current flowing therethrough. By properly selecting the resistance value, the size of the positive temperature coefficient resistance wire, and if required, the additional current drawn through the resistance wire to raise its temperature, the quiescent operating point for the collector current in the power transistor can be stabilized for a range of the order of 12 db gain variation in production run transistors. This wide gain variation between individual transistors can be accommodated in the circuit of the present invention without the use of a bias adjustment or the necessity of making the emitter resistor so large as to result in prohibitive power gain loss or curtailed power handling capabilities of the output stage.

Figure 1:
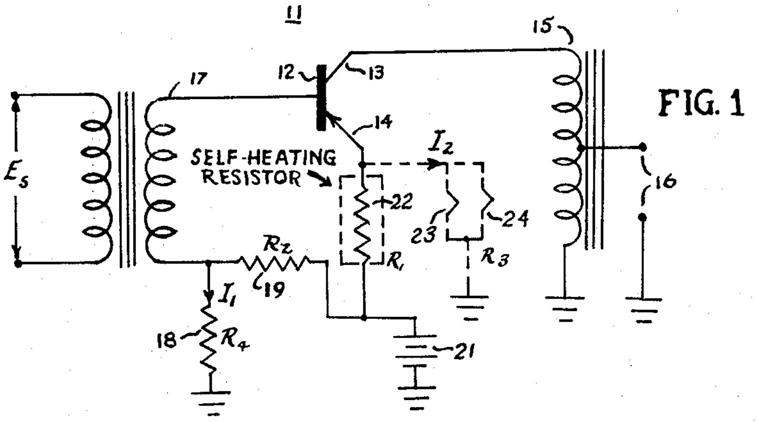
FIG. 1 is a schematic diagram of an audio amplifier stage of a radio receiver embodying the invention.

Referring now to FIG. 1, a circuit for a transistor 11, comprising base 12, collector 13 and emitter 14 is shown. The collector 13 is connected to an output load such as transformer 15 which may supply a loud speaker connected to terminals 16. The base 12 is driven by input signals from a transformer secondary 17, the remaining terminal of which is connected to the junction of resistors 18, 19 to supply bias potential to the base 12. Operating potentials for the circuit are obtained from a D.C. source 21, the negative terminal of which is grounded and the positive terminal of which is connected to resistor 19 and through the self-heating resistor 22 to the emitter 14. In accordance with conventional practice, the adjustment of the operating bias for a circuit similar to the one just described would require that resistor 18, 19 or 22 be an adjustable type unit which could be adjusted during the production of radio sets to establish the proper bias level for the individual transistor connected in the circuit. The only alternative to this adjustment which has heretofore been available has been to make the magnitude of resistor 22 large enough to introduce enough degeneration to stabilize the transistor for all range of gains to be encountered in the production run transistors. The use of degeneration to stabilize a circuit of this type is impractical due to the loss in power gain and the limitation of the power output capabilities of the stage.

The self-heating resistor 22, in accordance with the invention, is constructed to provide a resistance variation which is sensitive to current changes flowing through resistor 22. This may be accomplished in a particular instance by making resistor 22 a wire wound unit using sufficiently fine wire that the emitter current through emitter 14 will raise the temperature of the wire high enough above ambient temperature that the temperature of the wire will vary in accordance with the changes in current flowing through the wire.

Preferably, the characteristics of the wire from which the resistor is constructed include a high value for the temperature coefficient of resistance and a low value for the coefficient of thermal conductivity. By a judicious selection of material combining these characteristics and further by supporting the wire upon an insulating form which possesses low thermal conductivity and dissipation, a resistor can be constructed in which a comparatively modest current flow therethrough causes its temperature to stabilize at a point substantially above the ambient. At this elevated temperature the resistance no longer possesses a linear characteristic but varies in accordance with the current flow therethrough. The utilization of such a resistor operated at a temperature elevated substantially above ambient distinguishes the present invention from prior art circuits employing a positive temperature coefficient resistor solely for the purpose of compensating for variations in transistor characteristics induced by changes in the temperature of the environment. A positive temperature coefficient resistor operated at normal ambient temperatures (20–30° C.) possesses a resistance given by the relationship $$R_2=R_1(1+x(t_2-t_1))$$

where $R_2$ is the resistance of the resistor at a temperature $t_2$, $R_1$ is the resistance at temperature $t_1$, and $x$ is the resistance temperature coefficient. The function is linear throughout the normal range of ambient temperatures. At a constant temperature, a plot of current through the resistor against applied voltage yields a straight line the slope of which is constant, thus indicating that the resistance does not vary with current.

In accordance with this invention a resistor is constructed so that normal transistor bias and signal currents therethrough cause the resistor to be self-heating to a temperature substantially above ambient (approx. 150°) with the object of causing the resistance to depart from a constant of proportionality between voltage and current and thereby render the resistance a function of the current flow.

Figures 2, 3:
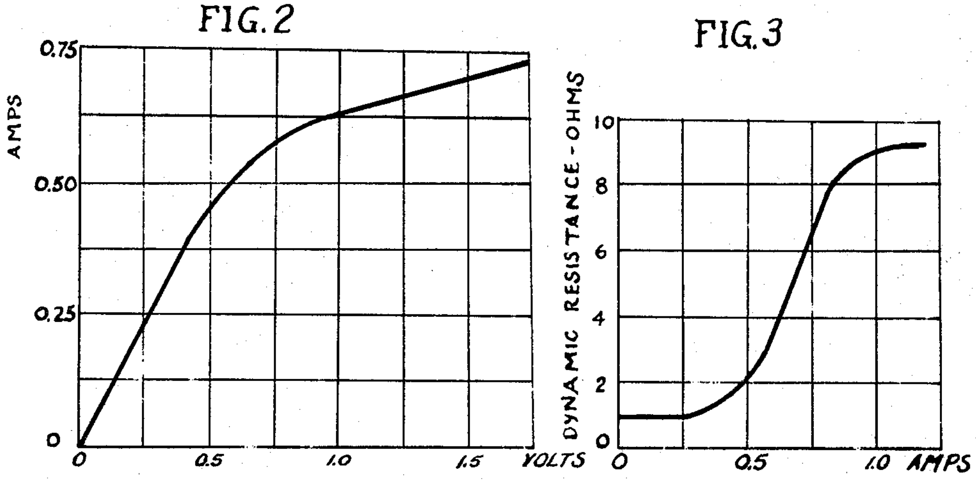
FIG. 2 is a plot of current against applied voltage for a resistor having limited thermal dissipation and thermal conductivity.
FIG. 3 is a plot of the dynamic resistance exhibited by the knee portion of the curve of FIG. 2.

As shown in FIG. 2, a plot of current against voltage for a resistor having limited thermal dissipation and conductivity exhibits a knee or sharp departure from linearity along the plot. The existence of the knee is believed to result from the transition from a convection mode of heat transfer at lower temperatures to a radiation mode at higher temperatures. By selecting the operating point of the transistor with which the self-heating resistor is combined to cause current flow corresponding approximately to that at the mid-point of the knee of the current voltage characteristic of the resistor, a current variable dynamic resistance is provided which stabilizes the transistor circuit against wide variations in transistor parameters and operating voltages.

FIG. 3 is a plot of the dynamic resistance of the knee portion of FIG. 2. A ten percent variation in current produces more than a sixty percent increase in dynamic resistance thereby substantially increasing the negative feedback afforded by the emitter resistor. The result of such stabilization is illustrated in the chart of FIG. 4.

Figure 4:
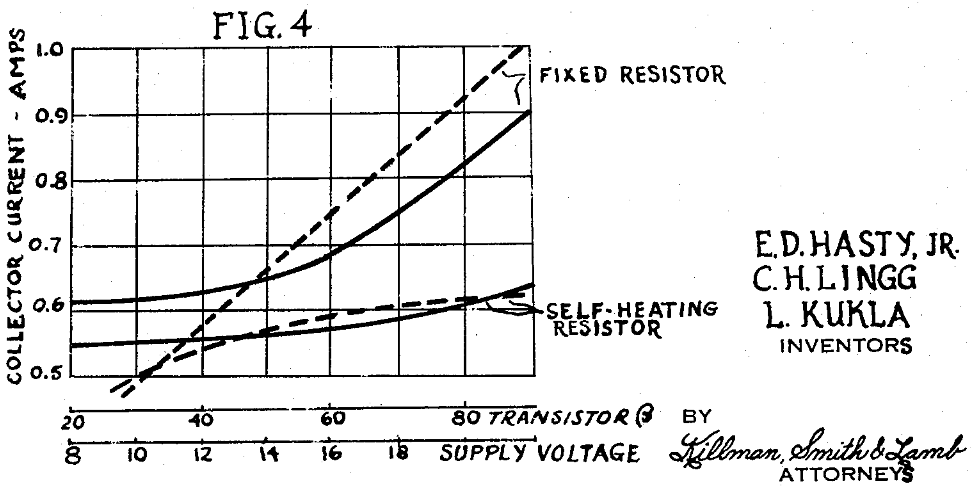
FIG. 4 is a chart comparing the operation of the present invention with a prior art circuit in which the emitter resistor is operated at ambient temperature.

In FIG. 4, the dashed-line curves show the variation of transistor collector current with various values of supply voltage. The solid-line curves show the variation of transistor collector current occurring when transistors having various values of $\beta$ are substituted in the circuits. The data for FIG. 4 was taken from identical circuits except that the emitter resistor for the lower set of curves was of the self-heating type in accordance with the invention. In the upper set of curves, a linear resistor operating at ambient temperature and therefore having a substantially fixed value was substituted for the self-heating resistor. The comparative flatness of the curves for the self-heating resistor circuit illustrates the substantial improvement in circuit stability afforded by the invention.

Again referring to FIG. 1, an alternative embodiment of the invention provides additonal resistors 23, 24 connected to the emitter 14, which may be the heaters of conventional vacuum tubes if the radio set is of the hybrid type employing both vacuum tubes and transistors. In all-transistor sets, resistors 23 and 24 may be pilot lights. With resistors 23, 24 connected to emitter 14, the additional current drawn through resistor 22 will be sufficient to permit resistor 22 to be made of larger diameter wire and still obtain the elevated temperature at which the resistance of resistor 22 will vary with the current flowing therethrough.

Without limiting the invention thereto, a particular set of values will be set forth to indicate one particular arrangement in accordance with the invention which has given highly satisfactory results. In the circuit shown resistor 22 was equal to 0.75 ohm at 25° C. and was made from number 33 positive temperature coefficient resistance wire of alloy No. 99 of Driver Harris Co. composed of substantially pure nickel and having a coefficient of 0.006 per ° C. Resistor 19 was 5.4 ohms made from number 29 Cupron wire with a low temperature coefficient while resistors 23, 24 were two tube heaters in parallel drawing a total current of 325 ma. and resistor 18 was two additional tube heaters in parallel drawing a total current of 300 ma. Transformers 17 and 15 were conventional audio driver and output transformers, respectively, and transistor 11 was a PNP audio output power transistor. The operating voltage of source 21 was 14.4 volts. With this circuit the variation in power gain among individual transistors within the range of 25 to 37 db produced a quiescent collector current in the range of 400 to 600 ma. stable within 50 ma. between ambient temperatures of minus 30° C. and plus 55° C. The signal gain and quality of signal output were well within the satisfactory range for any transistor used in the aforesaid ranges without the requirement of any adjustment whatsoever during production.

The circuit of the invention as disclosed thus provides in a transistor amplifier an extremely economical temperature sensitive component which can be manufactured from relatively large size wire which is easy to handle. The circuit of the invention thus eliminates a costly adjustable component and the labor cost required for making an adjustment of the component during production. In addition, the requirement for additional temperature stabilizing components and their attendant cost is eliminated.

Many modifications of the invention will now be apparent to those skilled in the art in the light of the present teaching and such modifications are to be considered within the scope of the invention as defined in the appended claim.

We claim:

A self-bias, stabilized gain transistor amplifier comprising

- a transistor connected in common emitter circuit configuration;
- a self-heating resistor composed of a metal alloy having a positive temperature coefficient of resistance and low thermal dissipation and low thermal conductivity connected in the emitter circuit of said amplifier so that the normal transistor current flow through said resistor continuously maintains the temperature of said resistor elevated approximately 150° C. above ambient, at which elevated temperature the resistance of said resistor varies with the current flow therethrough to supply a negative feedback voltage in the base-emitter circuit of said amplifier for the purpose of stabilizing the current flow through said transistor.

References Cited by the Examiner

UNITED STATES PATENTS

| | | | |
|---|---|---|---|
| 2,972,114 | 2/1961 | Silberbach | 330–24 X |
| 3,114,111 | 12/1963 | Hooten | 330—40 X |

FOREIGN PATENTS

| | | |
|---|---|---|
| 565,654 | 11/1958 | Canada. |

OTHER REFERENCES

Electronics World, October 1964, pp. 50–52 "Temperature Sensitive Devices" by John R. Collins, vol. 72, No. 4.

ROY LAKE, *Primary Examiner.*

NATHAN KAUFMAN, *Examiner.*